(12) United States Patent
Schönbächler et al.

(10) Patent No.: US 6,242,325 B1
(45) Date of Patent: Jun. 5, 2001

(54) METHOD FOR OPTIMISING THE ETCH RATE OF POLYCRYSTALLINE LAYER

(75) Inventors: Edgar Schönbächler, Hauterive (CH); Baudouin Lecohier, Ste Baume (FR)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 09/462,285

(22) Filed: Feb. 9, 2000

(30) Foreign Application Priority Data

Jul. 11, 1997 (EP) .................................................. 97111826

(51) Int. Cl.$^7$ .................................................. H01L 21/20
(52) U.S. Cl. ............................................ 438/488; 438/507
(58) Field of Search .................................... 438/307, 488, 438/507, 706, 710

(56) References Cited

U.S. PATENT DOCUMENTS

| | | | |
|---|---|---|---|
| 4,561,907 | * 12/1985 | Raicu ..................................... | 438/307 |
| 4,892,844 | 1/1990 | Cheung et al. ........................ | 437/194 |
| 5,322,712 | 6/1994 | Norman et al. ....................... | 427/250 |
| 5,344,793 | 9/1994 | Zeininger et al. .................... | 437/200 |

* cited by examiner

*Primary Examiner*—Keith Christianson
(74) *Attorney, Agent, or Firm*—Griffin & Szipl, P.C.

(57) ABSTRACT

The present invention concerns a method for optimising the etching rate of a polycrystalline layer having a predetermined composition comprising at least two chemical species arranged in the form of grains and grain boundaries, this layer having to be formed on a semiconductor substrate by a deposition process whose parameters have to be determined, and by a etching process with a reactive agent capable of reacting with the preponderant species in the layer. This method defines a structure parameter representing the grain boundary density of the layer, and comprises a step consisting in determining the smallest structure parameter value from among different samples having the predetermined composition, this value being considered as that which optimises the etching rate.

2 Claims, 4 Drawing Sheets

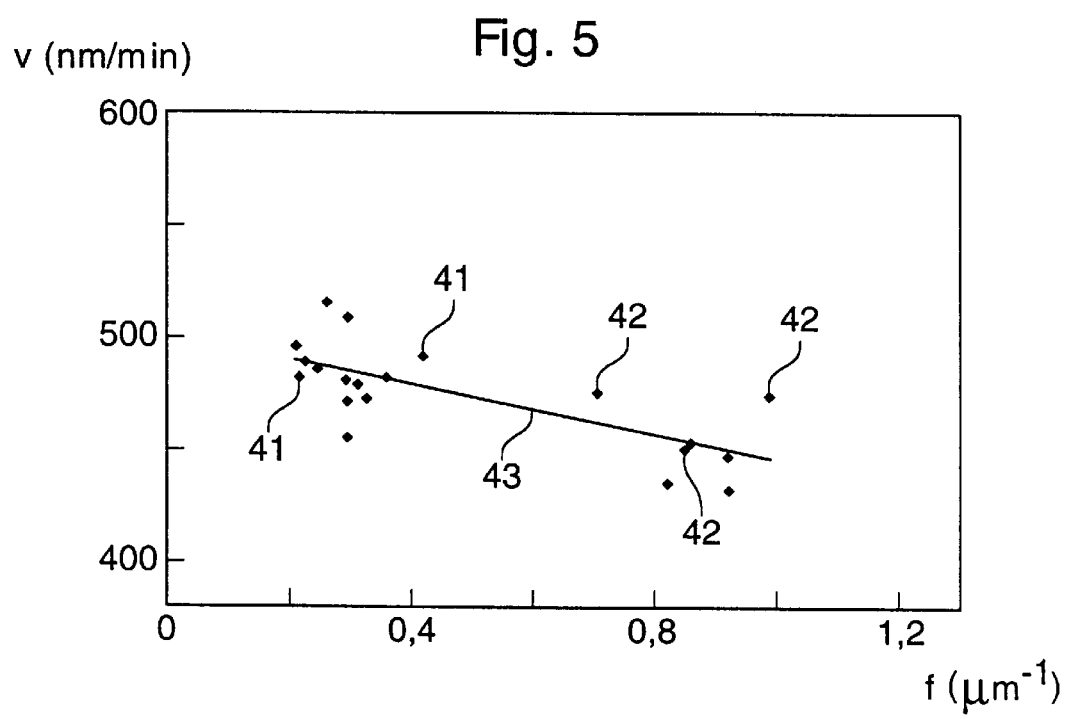

METHOD FOR OPTIMISING THE ETCH RATE OF POLYCRYSTALLINE LAYER

The present invention concerns the field of integrated circuit manufacturing and, more particularly, methods for optimising the etching rate of a polycrystalline layer to be deposited and etched during the manufacture of integrated circuits.

During a conventional integrated circuit manufacturing process, a stack of thin layers is formed on a semi-conductor substrate such as silicon. One will recall that there are three categories of chemical species to be considered in such a material: residual impurities such as the oxygen and carbon in the silicon, the doping impurities and, possibly, deliberately implanted impurities, for example during hydrogenation of a polycrystalline silicon layer.

Essentially, two types of deposition technique for forming a thin layer on a substrate can be distinguished. The so-called "physical" techniques are based on growth by condensation of molecular or atomic beam (neutral or ionised) on a substrate, these beams of particles being obtained by evaporation or sputtering from a source. Thus one speaks of deposition by vacuum evaporation, by cathodic sputtering, or molecular beam epitaxy. Furthermore, the so-called "chemical" techniques are based on a chemical reaction at the surface of the substrate, or of the layer which is in the process of being formed. This reaction releases chemical species which will intervene to assure or continue the growth of the layer. One thus speaks of deposition by liquid-phase or vapour-phase epitaxy.

In the rest of the process, the polycrystalline layers thereby formed are etched by wet process or dry process, via the action of a reactive agent. The current tendency veers towards dry process etching techniques, in particular plasma etching and, in particular, RIE (Reactive Ion Etching). One will recall that a plasma is a gas heated to a high temperature, rich in ions and free electrons. In a plasma etching reactor, electroluminescent discharges are produced at low pressure, and generate chemically active species. These species combine with each other at the surface of a layer placed in the reactor to be etched therein. During such etching, volatile compounds are formed and evacuated by a pumping system.

By way of example, etching of aluminium is achieved by a plasma formed of a chlorine gas such as BC13, said reactive agent being the chlorine. In this case, the presence of a gas such as BC13 is necessary to eliminate the native surface oxide, this oxide not being etched by pure chlorine.

In the present description, an etching rate, which can be defined as the ratio of the average etched thickness to the etching time necessary to perform such etching, is associated with an etching method.

Within the field of microelectronics, polycrystalline layers are used, for example for making electrical contacts. By way of example, the materials frequently used to form such layers include aluminium, silicon or silicides. One will recall that a silicide is a compound based on silicon and refractory materials such as tungsten, titanium or molybdenum.

Generally, a polycrystalline layer is formed of a mosaic of crystals or "grains", i.e. a periodic lattice network characterised by an elementary lattice, in which there exists a minimum number of crystallographic faults such as breaks in periodicity and residual impurities. One will recall that a polycrystalline layer is formed of grains attached along contact lines called "grain boundaries".

Given that the growth of a polycrystalline layer corresponds to the thermodynamic conditions giving rise to a nucleation phenomenon around a critical core, the maximum size of a grain is limited by the presence of a neighbouring grain. In other words, to the extent that the distribution of the critical cores is homogenous, so is that of the grain size of a polycrystalline layer formed by nucleation around such cores, and the sizes of such grains regroup around an average value, with very slight dispersion. One can thus define the average and the dispersion of the grain size of a polycrystalline layer, which will be designated respectively $\mu$ and $\sigma$ in the following description.

The Applicant of the present invention has noted that the structure of a polycrystalline layer is not generally taken into account during etching of such layer. In other words, account is usually taken of the macroscopic features of the layer to be etched, for example the thickness thereof.

Moreover, within the extremely competitive field of microelectronics, one of the main concerns lies in permanent research into reducing the manufacturing time for integrated circuits, and increasing the yield of the technical installations used during such manufacturing.

An object of the present invention is to provide a method for optimising the deposition and etching processes implemented during manufacturing of integrated circuits, this method being capable of increasing the yield of etching related equipment.

Another object of the present invention is to provide such processes answering conventional industrial cost and complexity criteria.

These objects, in addition to others are achieved by the optimisation method according to claim 1.

An advantage in determining the deposition parameters in the optimisation method according to the present invention is the ability to form a polycrystalline layer in which the density of the grain boundaries is linked to an optimum value of the etching rate, having the effect of increasing this rate, which translates into an increase in the yield of the etching related equipment.

These objects, features and advantages of the present invention, in addition to others, will appear more clearly upon reading the detailed description of a preferred implementation of the present invention, given solely by way of example, in relation to the annexed drawings, in which:

FIG. 5 shows experimental points connecting an etching rate and a structure parameter, and a curve illustrating the numerical approximation of these points.

Figure 1:
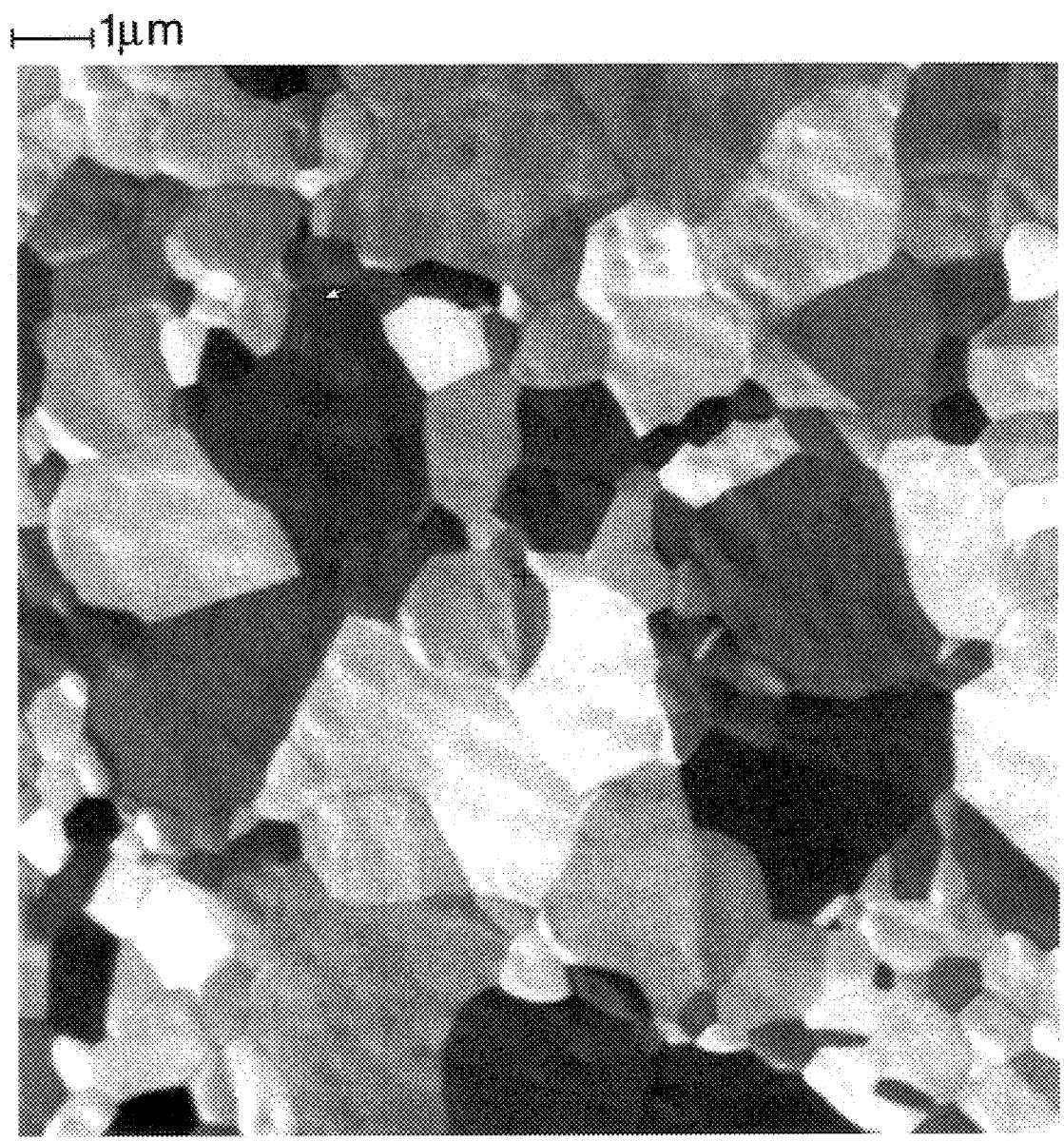
FIG. 1 shows a top view of a first polycrystalline layer.

The method according to the present invention is for optimising the etching rate of a polycrystalline layer having a predetermined composition of at least two chemical species arranged in the form of grains and grain boundaries. This layer must be made in a semi-conductor substrate such as silicon, by a deposition process and by an etching process of which one chemical agent can react with the chemical species which, of the two species, is preponderant, i.e. present in larger quantities the layer.

The method according to the invention includes a sequence of six successive steps consisting in determining the deposition parameters, in particular the temperature of the substrate, to form a polycrystalline layer able to be etched by the reactive agent at an optimum rate.

It goes without saying that deposition parameters other than the temperature of the substrate are relevant to the definition of the structure of the layer to be formed, in particular the crystallographic nature of the substrate, and the preparation of the surface thereof. However, the Applicant of the present invention has observed that the average polycrystalline layer grain size depends essentially on the substrate temperature during the formation of such layer. And only the substrate temperature will be considered in the description which follows.

The first step of the method according to the present invention consists in selecting at least two different substrate temperatures which will be designated by the respective references T1 and T2.

The second step of the method according to the present invention consists in forming, according to said deposition process, a first sample at temperature T1 and a second sample at temperature T2 of a polycrystanine layer having the same composition as said predetermined composition.

The third step of the method according to the present invention consists in determining the grain size average $\mu$ and dispersion $\sigma$ of the layer of each of the two samples formed in the second step. Such a determination of the average $\mu$ and the dispersion $\sigma$ is described in the article "Grain Growth in Metals" by P. Feltham in Acra Metallurgica, vol. 5, 1997, pp. 98 et seq. This determination uses a "log-normal" distribution of the layer grain size.

In the following description, the references $\mu 1$ and $\mu 2$ respectively designate the averages relating to temperatures T1 and T2, and the references $\sigma 1$ and $\sigma 2$ designate the dispersions relating to temperatures T1 and T2.

The fourth step of the method according to the present invention consists in calculating, from averages $\mu 1$ and $\mu 2$ and dispersions $\sigma 1$ and $\sigma 2$, two respective values f1 and f2 of a structure parameter f. The Applicant of the present invention defines structure parameter f as a function representing the grain boundary density of the polycrystalline layer, and has demonstrated that this parameter is a function of the polycrystalline layer grain size average $\mu$ and dispersion $\sigma$, and that this function has the following form:

$$f = 4 \frac{\mu}{\mu^2 + \sigma^2} \quad (1)$$

It will be noted that the reference f1 (f2 respectively) designates the value of structure parameter f for a value of average $\mu$ equal to $\mu 1$ ($\mu 2$ respectively) and a value of dispersion $\sigma$ equal to $\sigma 1$ ($\sigma 2$ respectively).

The fifth step of the method according to the present invention consists in comparing values f1 and f2 calculated in the fourth step. The Applicant of the present invention has observed that a negative gradient relationship exists between the structure parameter and the etching rate. Thus, the smallest value of the structure parameter can be determined from these two values, which allows the corresponding temperature (i.e. T1 or T2), which is considered as that which optimises the etching rate, to be determined.

The sixth step of the method according to the present invention consists in implementing the deposition process in accordance with the conditions determined in the fifth step, in particular at a substrate temperature equal to the temperature considered as optimising, then the etching process. As a result, the desired polycrystalline layer, i.e. that having said predetermined composition, can thus be formed from the deposition process in accordance with the substrate temperature determined by the method according to the present invention, and the etching process whose rate is optimum over the range of parameters selected during the first step of this method.

By way of illustration, a first implementation of the optimising method described hereinbefore will now be described, this implementation having been experimentally performed by the Applicant of the present invention. The Applicant wished to form a polycrystalline layer comprising 98.85% aluminium, 1% silicon and 0.15% titanium. It will be noted in this case that the preponderant species present in the layer is aluminium, the reactive agent being the chlorine.

The first step of the method consisted in selecting temperatures T1 and T2. In the above case, the Applicant of the present invention selected temperatures T1 and T2 equal respectively to 400° C. and 100° C.

Figure 2:
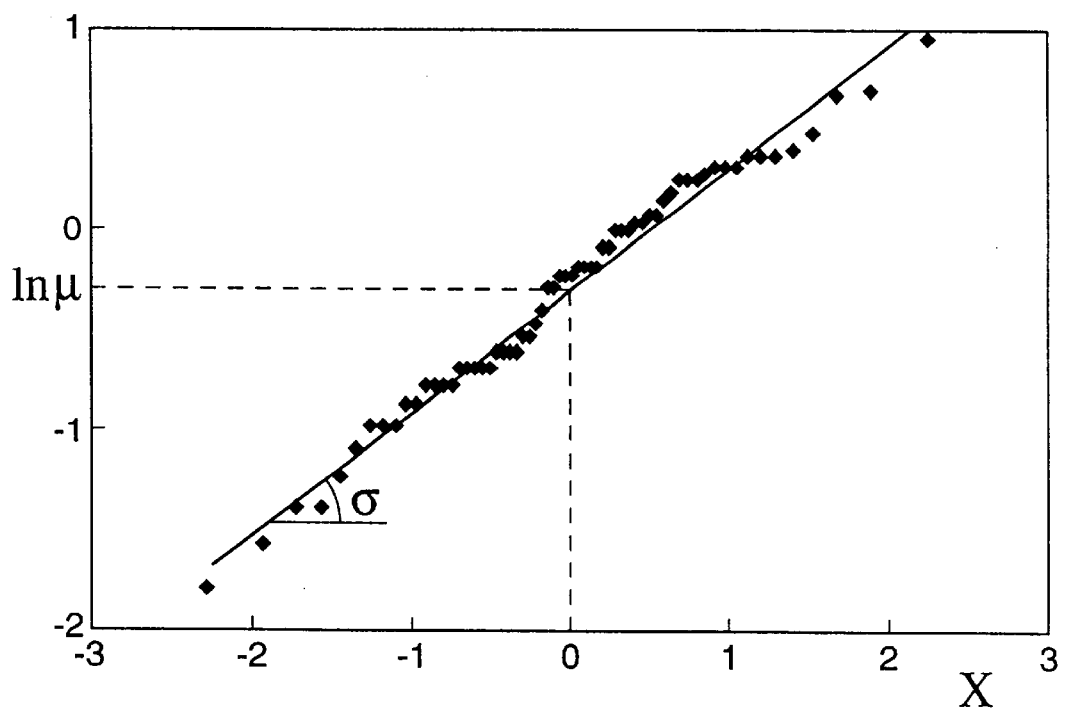
FIG. 2 illustrates the "log-normal" distribution of the grain size of the layer of FIG. 1.
Figure 4:
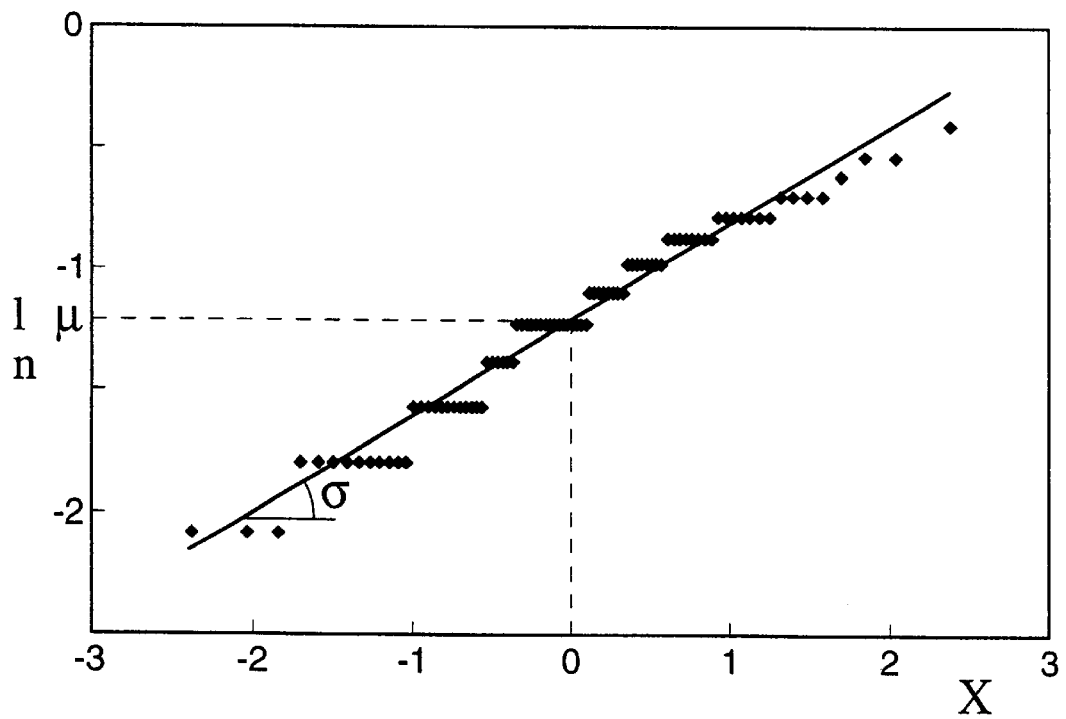
FIG. 4 illustrates the "log-normal" distribution of the grain size of the layer of FIG. 3.
Figure 3:
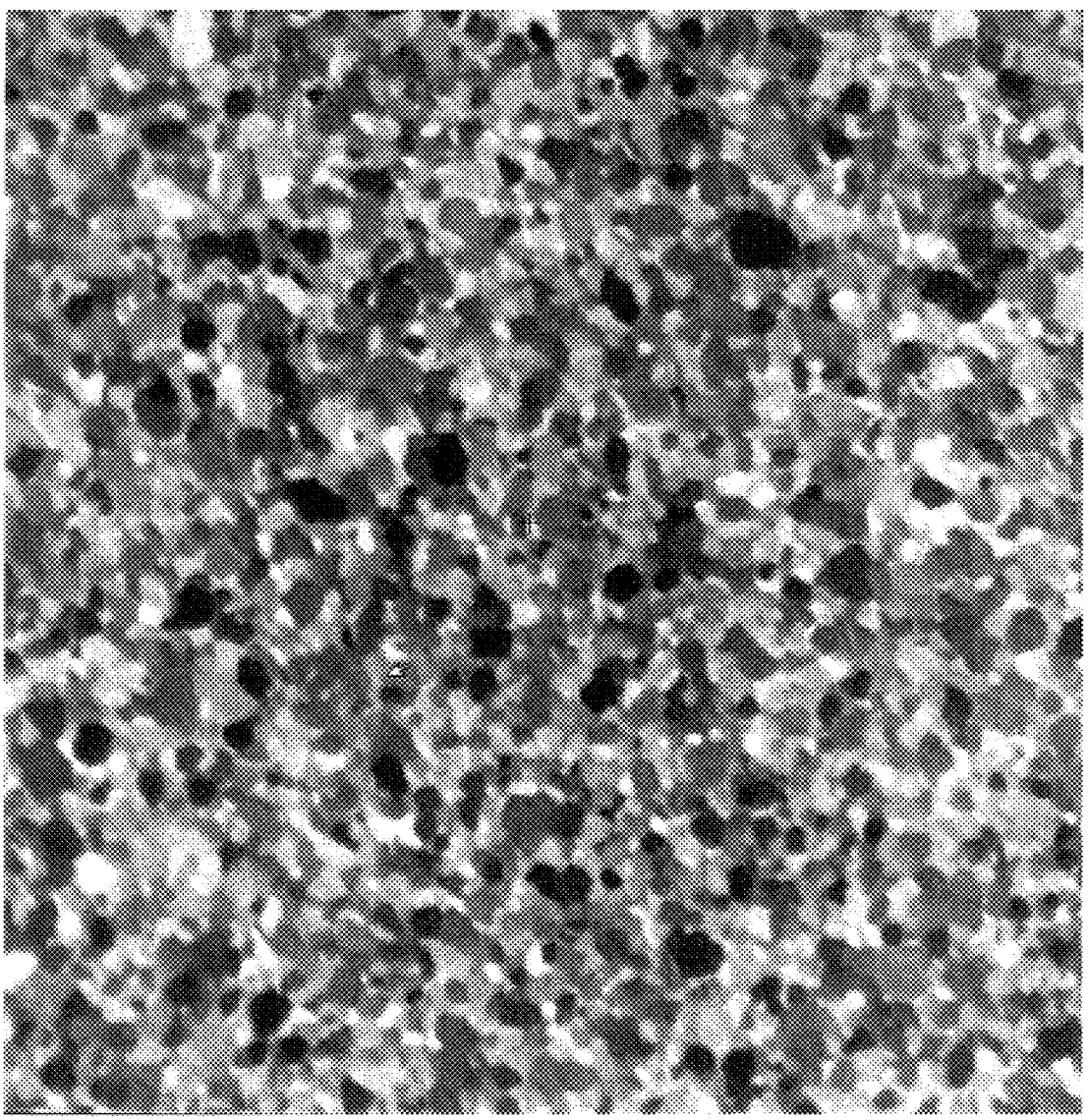
FIG. 3 shows a top view of a second polycrystalline layer.

During the second step of the method, two polycrystalline layer samples were formed, by cathodic sputtering. A first layer (having the aforementioned composition) was thus formed at 400° C., and FIG. 1 shows a top view of this layer, this view having been achieved with an FIB (Focused Ion Beam) microscope, at an angle of 30°. FIG. 2 illustrates the "log-normal" distribution of the grain size of the FIG. 1 layer. Likewise, a second layer (having the aforementioned composition) was thus formed at 100° C., FIG. 3 shows a top view of this layer, this view having been achieved with an FIB microscope at an angle of 30°, and FIG. 4 illustrates the "log-normal" distribution of the grain size of the FIG. 3 layer.

The third and fourth steps of the method consisted respectively in determining values $\mu 1$, $\sigma 1$, $\mu 2$ and $\sigma 2$, as described in the aforecited article "Grain Growth in Metals", and calculating the values f1 and f2 of structure parameter f, from values $\mu 1$, $\sigma 1$, $\mu 2$ and $\sigma 2$ and the equation (1). These different values are set out in the table hereinbelow.

TABLE I

| Sample i | i = 1 | i = 2 |
| --- | --- | --- |
| Ti (° C.) | 400 | 100 |
| $\mu i$ (nm) | 735 | 295 |
| $\sigma i$ | 0.602 | 0.394 |
| fi ($\mu m^{-1}$) | 0.21 | 0.91 |

The fifth step of the method consisted in comparing values f1 and f2, and determining from among these two values the smallest structure parameter value, thereby allowing the corresponding temperature (i.e. T1 or T2) which is considered as that which optimises the etching rate, to be determined. It is clear from table I that, in this case, said optimising temperature is 400° C., i.e. a temperature allowing the formation of a polycrystalline layer having a small grain boundary density.

The sixth step of the method would consist of forming a polycrystalline layer having the aforecited composition by cathodic sputtering, at a substrate temperature equal to 400° C., then etching said layer by an etching process called "RIE", the deposition process and the etching process being generally implemented to optimise the etching rate.

In order to confirm such a result, the Applicant of the present invention has measured the etching rate for each of the two samples. Etching rate values v1 and v2 for temperatures T1 and T2 are set out in table II hereinafter.

TABLE II

| Sample i | i = 1 | i = 2 |
| --- | --- | --- |
| Ti (° C.) | 400 | 100 |
| vi (nm/min) | 490 | 450 |

It is clear from this Table that the etching rate is optimum for temperature T1 equal to 400° C., as was previously stated. An improvement of 8.8% between values v1 and v2 of Table II will be noted.

In order to summarise the preceding experimental results, the Applicant of the present invention has graphically represented the relationship between etching rate v and structure parameter f of different samples formed at 400° C. or at 100° C. FIG. 5 shows a set of experimental points 41 and 42, each point 41 (42 respectively) illustrating the relationship between etching rate v and structure parameter f of a sample formed at 400° C. (100° C. respectively), and a linear approximation of these points illustrated by straight line 43.

It will be noted that straight line 43 has a negative gradient, which means that etching rate v tends to decrease with structure parameter f, i.e. with the substrate temperature, in the temperature range selected during the first step of the optimising method. It will be recalled that the example illustrating the implementation of this method, in relation to FIGS. 1 to 6, concerns the case of an etching agent able to react with the preponderant chemical species present in the grains.

Also by way of illustration, similar results obtained during a second implementation of the method according to the present invention can be cited, in the case of a polycrystalline layer formed of titanium and tungsten. The Applicant of the present invention then measured the etching rate for first and second samples of such a layer formed at 20° C. and 250° C. respectively.

The values vi of the etching rate of the first and second samples formed of titanium and tungsten, for the corresponding temperatures Ti are set out in Table III hereinbelow.

TABLE III

| Sample i | i = 1 | i = 2 |
|---|---|---|
| Ti (° C.) | 250 | 20 |
| vi (nm/min) | 101 | 94 |

It is clear from this Table that the etching rate is optimum for the highest temperature of temperatures T1 and T2, i.e. 250° C. An improvement of 7.4% between values v1 and v2 of Table II will be noted, which confirms the tendency observed in relation to Table II.

It goes without saying for those skilled in the art that the detailed description hereinbefore can undergo various modifications without departing from the scope of the present invention. By way of alternative, this method can be implemented with a chemical agent able to react with the preponderant chemical species present in the grain boundaries, contrary to the example described hereinbefore in relation to FIGS. 2a, 2b, 3a, 3b and 4.

For this purpose, one will recall that the existence of grain boundaries in a polycrystalline layer involves segregation of the chemical species of such layer. Table IV summaries hereinbelow several chemical species designated A liable to become segregated in polycrystalline layers including a preponderant chemical species designated B.

TABLE IV

| A | B |
|---|---|
| H, C, Cu, P, B | Si |
| Sn | GaAs |
| Fe, Ni, Al, C, O, Ti, Cu, Mg | Si |

TABLE IV-continued

| A | B |
|---|---|
| $Ga_2O_3$, $As_2O_3$ | GaAs |
| Bi | Zno |

It will be noted that in Table IV aluminium and silicon are two species liable to become segregated.

What is claimed is:

1. Method for optimising the etching rate of a polycrystalline layer having a predetermined composition of at least two chemical species arranged in the form of grains and grain boundaries, said layer having to be formed on a semiconductor substrate by a deposition process whose parameters such as the substrate temperature have to be determined, and by an etching process whose a chemical agent can react with one of said two chemical species which is the preponderant species in the layer, said method including:

a first step consisting in selecting at least first and second different substrate temperatures (T1; T2);

a second step consisting in forming, according to said deposition process, at said first and second substrate temperatures, first and a second respective samples having the same composition as said predetermined composition;

a third step consisting in determining the first and second averages ($\mu1$; $\mu2$) and the first and second dispersions ($\sigma1$; $\sigma2$) of the grain sizes of the layer respectively formed at said first and second substrate temperatures from said first and second samples a fourth step consisting in calculating, from said first and second averages and said first and second dispersions, first and second values (f1; f2) of a structure parameter (f) representing the grain boundary density of the layer, this parameter being defined as a function of the average ($\mu$) and the dispersion ($\sigma$) of the grain size of the polycrystalline layer formed of said chemical species;

a fifth step consisting in determining the smallest parameter structure value from among those calculated in said fourth step, the temperature corresponding to this structure parameter value being considered as that which optimises the etching rate; and a sixth step consisting in implementing the deposition process according to the conditions determined in the fifth step, then the etching process, to make the polycrystalline layer.

2. Optimising method according to claim 1, wherein the function used for calculating the structure parameter (f) during said fourth step, has the following form:

$$f = 4\frac{\mu}{\mu^2 + \sigma^2}$$

where the reference f designates said structure parameter, and the references $\mu$ and $\sigma$ designate respectively said average and said dispersion of the grain size of the polycrystalline layer.

* * * * *

UNITED STATES PATENT AND TRADEMARK OFFICE
CERTIFICATE OF CORRECTION

PATENT NO. : 6,242,325 B1
DATED : June 5, 2001
INVENTOR(S) : Edgar Schönbächler and Baudouin Lecohier It is certified that error appears in the above-identified patent and that said Letters Patent is hereby corrected as shown below:

Title page
Please change the title to read as follows:

-- METHOD FOR OPTIMISING THE ETCHING RATE OF POLYCRYSTALLINE LAYER --

Please add the PCT information as follows:

-- PCT Filed: June 5, 1998
PCT No.: PCT/EP98/03391
§ 371 Date: February 9, 2000
§ 102 (e) Date: February 9, 2000
PCT Pub. No.: WO99/03142
PCT Pub. Date: January 21, 1999 --

Signed and Sealed this

Eleventh Day of June, 2002

Attest:

JAMES E. ROGAN
Attesting Officer          Director of the United States Patent and Trademark Office